United States Patent [19]
Bastani et al.

[11] Patent Number: 5,554,554
[45] Date of Patent: Sep. 10, 1996

[54] PROCESS FOR FABRICATING TWO LOADS HAVING DIFFERENT RESISTANCE LEVELS IN A COMMON LAYER OF POLYSILICON

[75] Inventors: Bamdad Bastani, Danville, Calif.; Larry Wong, Hillsboro, Oreg.

[73] Assignee: National Semiconductor Corporation, Santa Clara, Calif.

[21] Appl. No.: 198,698

[22] Filed: Feb. 18, 1994

Related U.S. Application Data

[62] Division of Ser. No. 104,389, Aug. 9, 1993, abandoned, which is a division of Ser. No. 852,357, Mar. 17, 1992, abandoned, which is a continuation of Ser. No. 270,928, Nov. 14, 1988, abandoned.

[51] Int. Cl.$^6$ ................................................. H01L 21/8244
[52] U.S. Cl. ............................. 437/47; 437/191; 437/918
[58] Field of Search ............................. 437/46, 47, 59, 437/191, 918; 148/DIG. 136

[56] References Cited

U.S. PATENT DOCUMENTS

| | | | |
|---|---|---|---|
| 4,178,674 | 12/1979 | Liu et al. | 437/191 |
| 4,349,584 | 9/1982 | Flatley et al. | 437/981 |
| 4,372,034 | 2/1983 | Bohr | 437/228 |
| 4,435,896 | 3/1984 | Parrillo et al. | 437/34 |
| 4,505,026 | 3/1985 | Bohr et al. | 437/981 |
| 4,516,316 | 5/1985 | Haskell | 437/34 |
| 4,554,726 | 11/1985 | Hillenius et al. | 437/34 |
| 4,613,885 | 9/1986 | Haken | 437/57 |
| 4,727,045 | 2/1988 | Cheung et al. | 437/47 |
| 4,761,384 | 8/1988 | Neppl et al. | 437/29 |
| 4,803,179 | 2/1989 | Neppl et al. | 437/70 |
| 4,824,767 | 4/1989 | Chambers et al. | 437/982 |
| 4,879,253 | 11/1989 | Wakamatsu | 437/240 |

FOREIGN PATENT DOCUMENTS

| | | |
|---|---|---|
| 0037040 | 10/1981 | European Pat. Off. . |
| 0232508 | 8/1987 | European Pat. Off. . |
| 59-086225 | 9/1984 | Japan . |
| 0048027 | 3/1987 | Japan ............................ 148/DIG. 133 |
| 0166522 | 7/1987 | Japan ...................................... 437/982 |
| 63-202055 | 8/1988 | Japan . |
| 8505736 | 12/1985 | WIPO . |

OTHER PUBLICATIONS

Sze, "VLSI Technology", 1983, pp. 473–476.
Widmann, D., et al., "Technologie hochintegrierter Schaltungen," 1988, Springer–Verlag, Berlin, Germany.
English translation of Yamanochi–JP–62–166522.
English translation of Ogawa–0048027.

*Primary Examiner*—Chandra Chaudhari
*Attorney, Agent, or Firm*—Limbach & Limbach

[57] ABSTRACT

The present invention provides a method of forming a first load having a first resistance level and a second load having a second resistance level in a common layer of polysilicon. In accordance with the method, a layer of polysilicon having a first resistance level is formed on a semiconductor circuit structure. A mask is then formed on the polysilicon layer to define areas of the polysilicon to be implanted with a dopant. The dopant is then implanted into the defined areas of the polysilicon to modify these areas to have a second resistance level. Selected areas of the polysilicon layer are then etched away to form first load regions having the first resistance level and second load regions having the second resistance level.

2 Claims, 7 Drawing Sheets

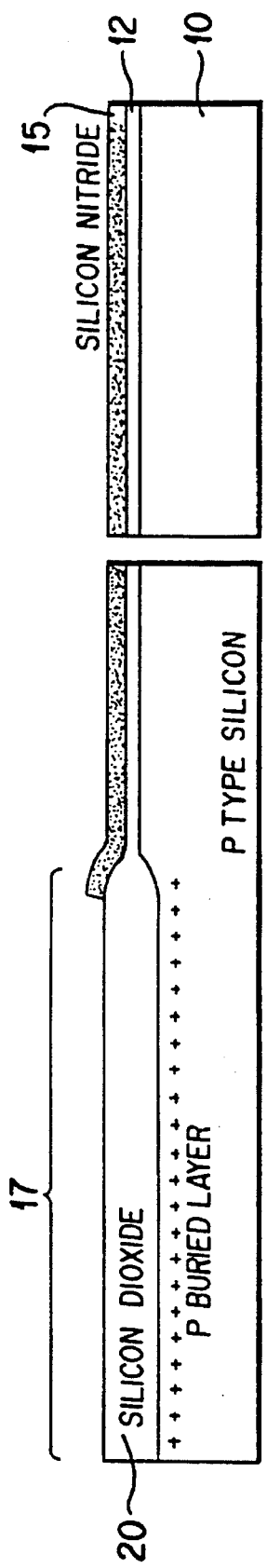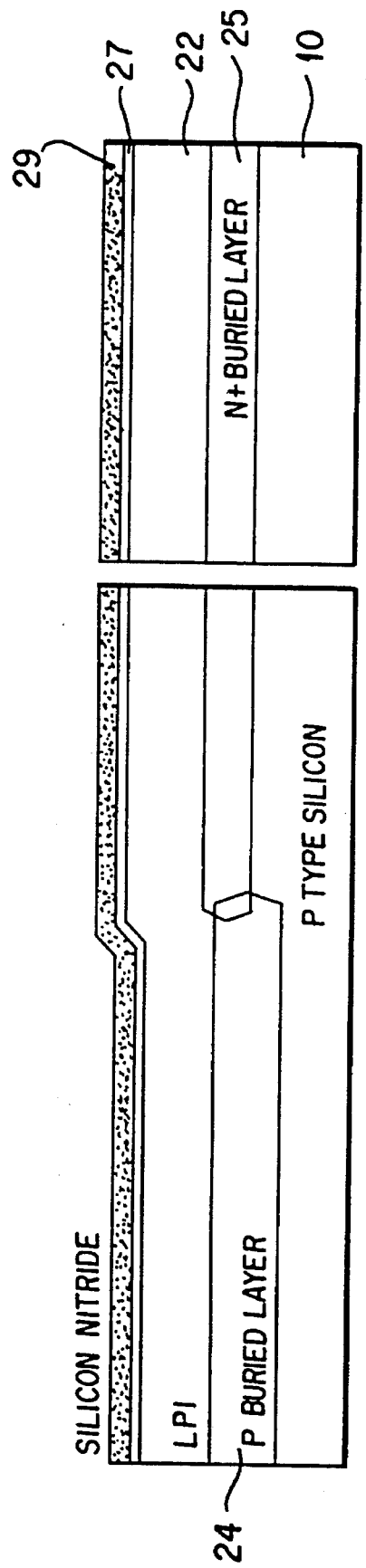
FIG. 1
FIG. 2

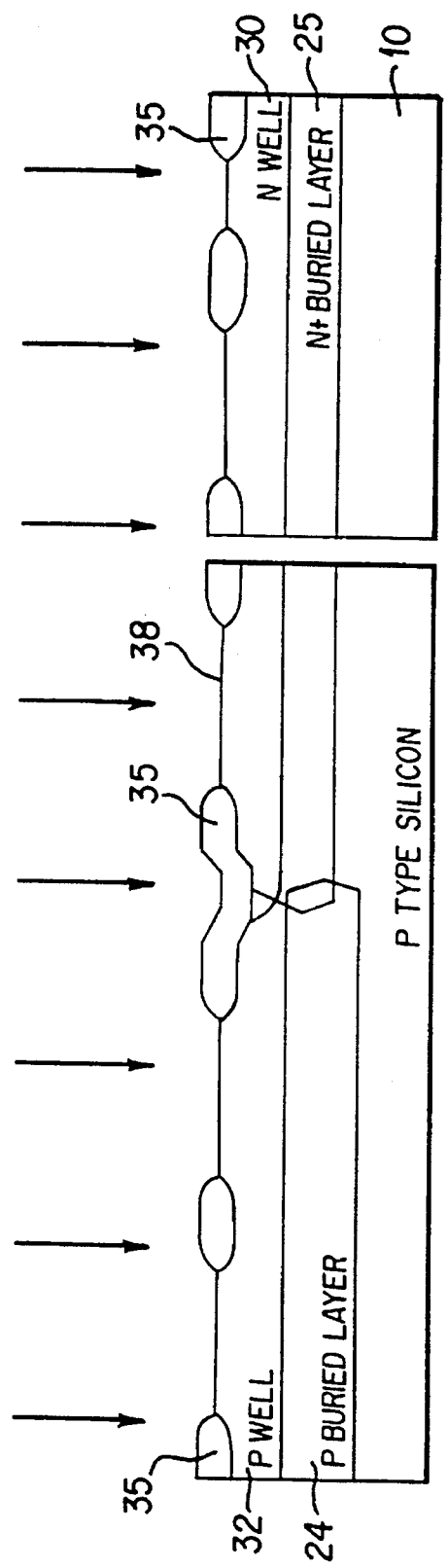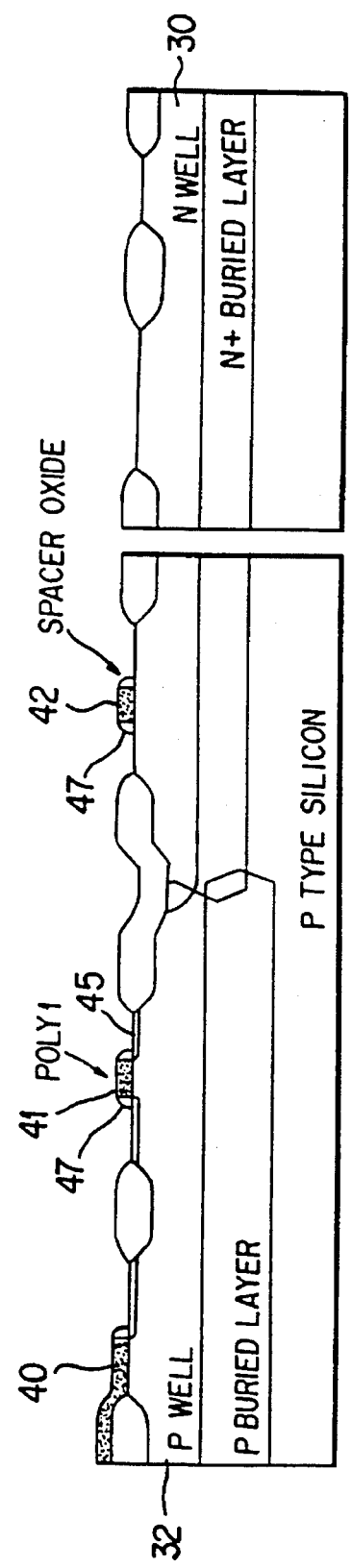
FIG.5
FIG.6

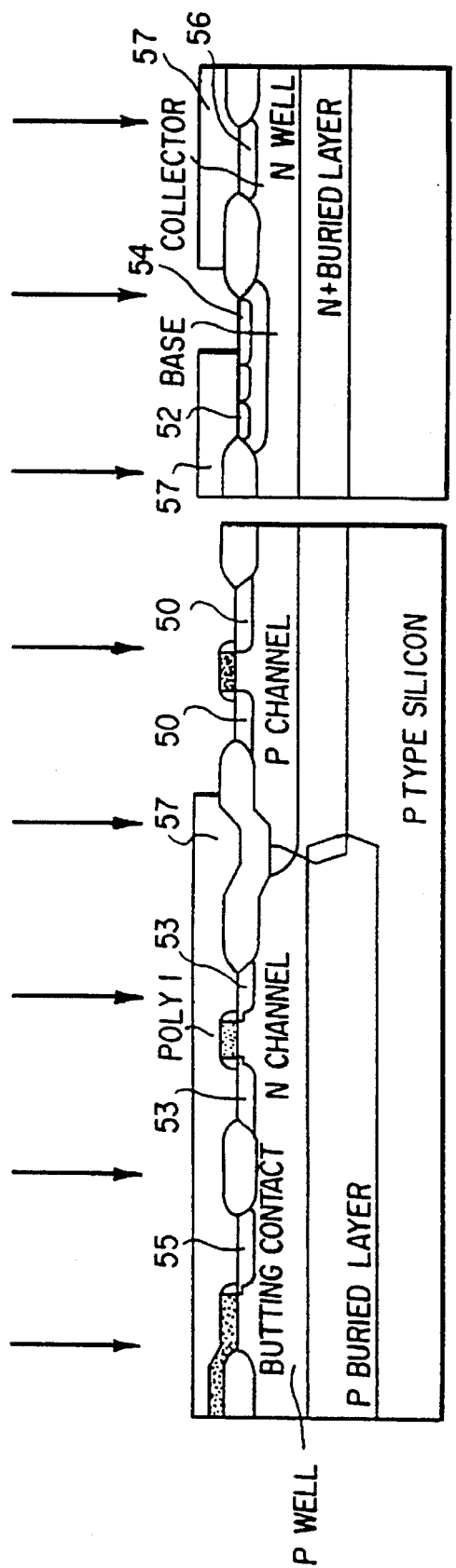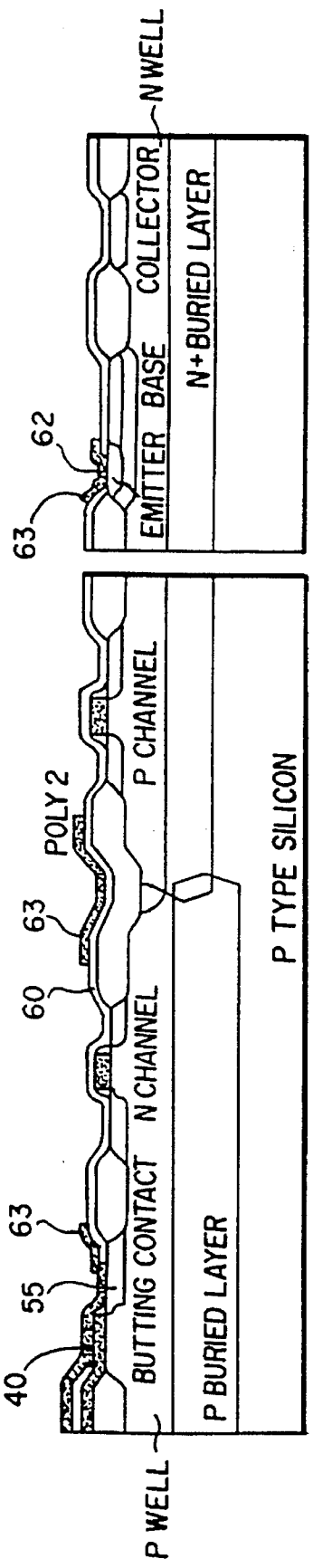
FIG. 7
FIG. 8

5,554,554

PROCESS FOR FABRICATING TWO LOADS HAVING DIFFERENT RESISTANCE LEVELS IN A COMMON LAYER OF POLYSILICON

This is a Division of application Ser. No. 08/104,389 filed on Aug. 9, 1993, abandoned, which is an FWC Divisional application of Ser. No. 07/852,357 filed on Mar. 17, 1992 now abandoned, which is an FWC application of 07/270,928 filed on Nov. 11, 1988 now abandoned.

BACKGROUND OF THE INVENTION

1. Field of the Invention

This invention relates to the fabrication of integrated circuits which employ both bipolar and complementary field effect transistors on a common substrate, more typically known as BiCMOS processes. In particular, the invention provides a process in which the P- and N-type buried layers are self-aligned with each other, and in which the P- and N-type wells in an spitaxial layer are self-aligned with each other and substantially coplanar. Furthermore, the process of the invention enables the formation of polycrystalline silicon load resistors and double-diffused emitters for bipolar devices. The process also provides an improved technique for forming openings in passivation layers separating electrical conductors or electrical conductors from the substrate in such circuits.

2. Description of the Prior Art

Many different BiCMOS processes are now well known in the semiconductor fabrication industry. Such processes, however, suffer from a number of unfortunate disadvantages. Disadvantages of such processes involve the difficulty of aligning the P- and N-type buried layers in the substrate, as well as aligning and planarizing the P and N conductivity-type wells in the spitaxial layer disposed on the substrate.

Another disadvantage of prior art BiCMOS processes is the difficulty of fabricating polycrystalline resistors in structures manufactured utilizing the process. Because of the sequence of process steps, it typically has been difficult to accurately dope the polycrystalline silicon and obtain the desired resistance. Such limitations in the process technology unduly restrict the freedom of the circuit designer, and are therefore, undesirable.

Another disadvantage relates to the use of numerous layers of electrical interconnections, now well known in the fabrication of integrated circuits. For example, integrated circuits using two layers of polycrystalline silicon interconnections are well known, as are circuits using more than one metal layer. In the formation of such circuits, defects often arise where contact openings must be made through insulating layers to underlying regions, whether conductive or semiconductive.

As the density of active and passive devices on a given size integrated circuit continues to increases, the importance of forming reliable contact openings also increases. In the lower density circuits of the prior art, large areas were available for the formation of contacts, enabling the use of large openings, and relatively thick layers of metal or polycrystalline silicon connections. Because of the layer's thickness, difficulties in traversing steps or other nonlinearities in the underlying surface were minimized.

With the advent of increasingly large integrated circuits, for example, circuits containing a million or more transistors on a chip, very small feature sizes are required, lessening the ability to use large contact openings and thick layers of electrical connections. Accordingly, the provision of reliable electrical connections for such circuits has become increasingly difficult.

Furthermore, as device scaling continues to shrink feature sizes in integrated circuit technology, the formation of contacts becomes more difficult. In prior art processes, a wet-etch was typically employed which, due to its isotropic nature, provided a slope to the opening for good metal step coverage. The increasing density of circuits, however, often results in a wet-etch expanding the contact region to a point where when the metal or other conductor is deposited, shorts are created to adjacent conductive regions, once the opening is filled with metal.

Numerous techniques are well known for the fabrication of emitters in integrated circuits. For example, the formation of emitters using well known masking and diffusion or ion-implantation processes are well known. More recently, the fabrication of emitters from the out diffusion of impurities from doped overlying layers, such as polycrystalline silicon, has become well known.

Unfortunately, this aspect of the prior art processes suffer from a variety of disadvantages. The conventional diffusion/ion-implantation techniques require the formation of a mask and the introduction of impurities through openings in the mask. Because the mask must be accurately positioned with respect to surrounding portions of the transistor, or other surrounding regions, allowance must be made for alignment errors. This undesirably increases the size of the devices formed. Formation of emitters by out diffusion of impurities from doped polycrystalline silicon layers also suffers from several disadvantages. In particular, a very thin layer of silicon dioxide typically will be formed on the substrate from exposure of the substrate to air preceding and during formation of the emitter contact regions. This interface oxide undesirably increases the emitter series resistance. Additionally, the out diffusion process requires a very shallow base region because of the shallow emitter. Such shallow bases are well known to have high base resistance, thereby undesirably increasing switching speeds.

SUMMARY OF THE INVENTION

In one embodiment this invention provides a technique for forming self-aligned buried layers, as well as self-aligned coplanar wells in a BiCMOS integrated circuit. A first conductivity-type buried layer is doped using a conventional silicon-nitride-on-silicon-dioxide mask to block doping from the portions of the wafer where it is not desired. The doped region is then oxidized with a sufficient thickness of silicon dioxide to block further impurity from this region. The silicon nitride is then removed and the opposite conductivity-type buried layer doped using the thick silicon dioxide as a mask. At the completion of the process, the silicon dioxide layer is removed and an epitaxial layer is formed. The P and N conductivity-type wells for the bipolar and CMOS devices are then formed using a similar technique. Later, in a preferred embodiment of the process of the invention, polycrystalline silicon resistors are formed by depositing a layer of polycrystalline silicon, masking it and doping it, and then patterning it using conventional photolithographic techniques.

This invention also provides a technique for both planarizing and forming openings in insulating layers separating conductive layers from each other, or from the underlying semiconductor, which enables the electrical connections formed to more reliability traverse nonlinearities, such as presented by the edges of such openings. Using the technique of this invention, after forming the desired electrode pattern on a semiconductor structure, the electrode pattern is coated with two layers of material—first a relatively thin layer of undoped silicon dioxide, followed by a thicker overlying layer of boron- and phosphorus-doped silicon dioxide. In the preferred embodiment about 2% boron and 6.5% phosphorus are used to dope the overlying thicker layer. By heat treating the upper layer at an appropriate temperature, it becomes relatively self-leveling to provide a more planar surface upon which the contact mask may be defined. Both undoped and doped glass are first etched using a dry anisoptropic process to obtain vertical sides for the contact openings. By next etching the dielectric layer using a hydrofluoric acid mixture, the isotropic process stops when it reaches the undoped underlying glass. The combination of the wet process with the dry process provides contact openings which are smoothly contoured at their uppermost regions and taper down to vertically-sided openings where they extend to the underlying electrically-conductive layer.

In a preferred embodiment, a method of forming contact openings in an integrated circuit includes the steps of depositing on a selected material a first layer of undoped silicon dioxide, depositing on the first layer a second layer of doped silicon dioxide, and then forming a contact mask. Contact openings are etched anisotropically through both layers, then isotropically to provide a smoothly contoured profile.

This invention provides a technique for forming improved emitters in bipolar transistors, permitting the formation of deeper base regions with lower resistance, as well as almost complete self alignment of the emitter within the bipolar transistor. Using the technique of this invention, a silicon dioxide or other layer of insulating material is formed across the region where the emitter is desired, and an opening provided therein. The desired conductivity type impurity is introduced through the opening to form the emitter. Next, a layer of polycrystalline silicon is deposited across the opening and onto the surrounding insulating layer. After doping of this layer of polycrystalline silicon, the structure is heated to cause diffusion out of the polycrystalline silicon and into the substrate. This diffusion assists in breaking down the interface oxide, thereby improving overall device performance.

In a preferred embodiment of the invention, a method for forming a doped emitter region in a semiconductor structure comprises defining a location on a semiconductor substrate for the emitter by forming a mask having an opening at that location. Dopant then is introduced into the substrate through the opening from a source of selected conductivity-type impurity. Next, a layer of material is deposited across the opening in contact with the region, the material containing a dopant of the selected conductivity type. Finally, the layer is treated to cause some of the dopant therein to move into the substrate.

In another embodiment, the present invention provides a method of forming a first load having a first resistance level and a second load having a second resistance level in a common layer of polysilicon. In accordance with the method, a layer of polysilicon having the first resistance level is formed on a semiconductor circuit structure. A mask is then formed on the polysilicon layer to define areas of the polysilicon to be implanted with a dopant. The dopant is then implanted into the defined areas of the polysilicon to modify these areas to have a second resistance level. Selected areas of the polysilicon layer are then etched away to form first load regions having the first resistance level and second load regions having the second resistance level.

BRIEF DESCRIPTION OF THE DRAWINGS

FIG. 1 is a cross-sectional view of a semiconductor structure after formation of a P-type buried layer and overlying silicon dioxide region;

FIG. 2 is a subsequent cross section after deposition of an epitaxial layer;

FIG. 5 is a subsequent cross section after a threshold adjustment implant;

FIG. 6 is a subsequent cross section after formation of a spacer oxide regions on the MOS transistor gates;

FIG. 7 is a subsequent cross section after implanting the P channel source/drain and bipolar base;

FIG. 8 is a subsequent cross section after definition of a second layer of electrodes;

DETAILED DESCRIPTION OF THE PREFERRED EMBODIMENTS

Figure 4:
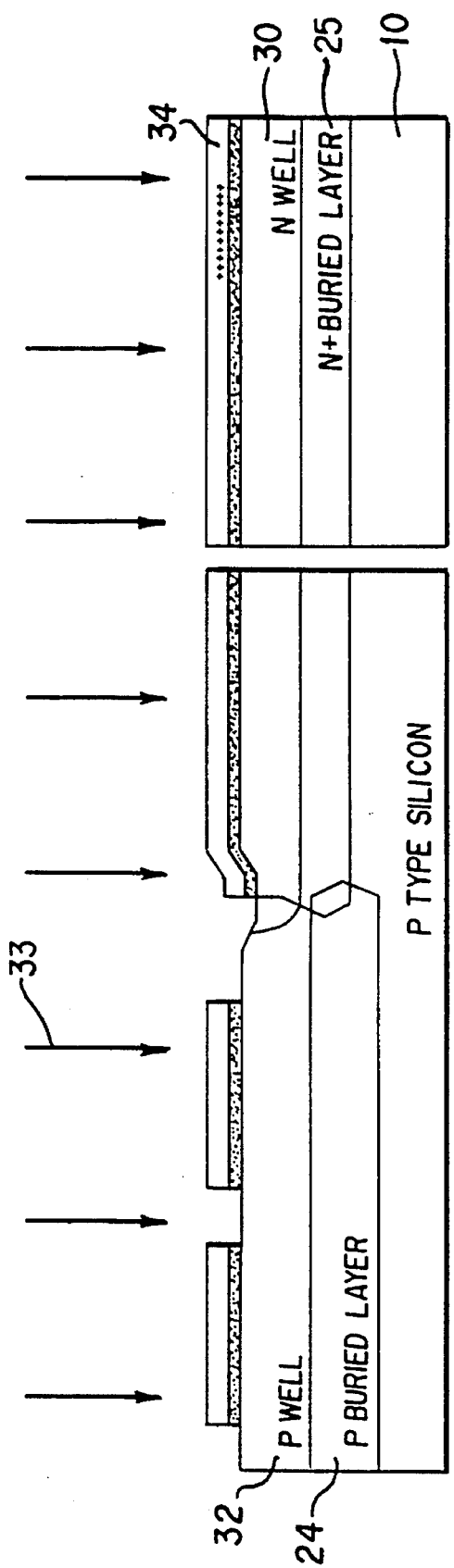
FIG. 4 is a subsequent cross section after implantation of the field regions for the N channel devices.

The process of this invention will be described in a preferred embodiment, with the left-hand portion of the figures illustrating the formation of CMOS transistors, while the right-hand portion illustrates the formation of bipolar transistors.

FIG. 1 is a cross-sectional view of a portion of a semiconductor structure from which a bipolar-complementary metal oxide semiconductor (BiCMOS) structure will be fabricated. The structure of FIG. 1 includes a P-type silicon substrate 10 upon which a relative thin layer of silicon dioxide 12 is formed by a well known thermal oxidation process. On the upper surface of layer 12, a layer of silicon nitride 15 is deposited using chemical vapor deposition. Then, using well known photolithographic techniques, the silicon nitride is masked and etched to expose a region 17 wherein a P conductivity type buried layer is desired. The buried layer is implanted using boron or other P-type dopant. Next, an oxidation step is performed to create a relatively thick region of silicon dioxide 20 over the portion of the structure where the P-type dopant was introduced. In the preferred embodiment, layer 20 will be sufficiently thick to prevent ions from passing through it during a subsequent ion-implantation step. The appearance of the structure following these steps is shown in FIG. 1.

The remaining silicon nitride layer 15 then is removed using well known wet-etching processes, and an N-type buried layer implant performed, for example, using arsenic, phosphorus, or other suitable dopant. Then all of the remaining silicon dioxide regions 12 and 20 are removed from the surface of the silicon 10 and a layer of epitaxial silicon 22 deposited. During this step, the implanted P-type and N-type impurities will diffuse outward to form a P-type buried layer 24 and an N-type buried layer 25. Next, the structure is oxidized to form a thin layer of silicon dioxide 27 across the upper surface of the epitaxial layer, and then another layer of silicon nitride 29 is deposited over the oxide 27. The appearance of the structure after these steps of the process is shown in FIG. 2.

Figure 3:
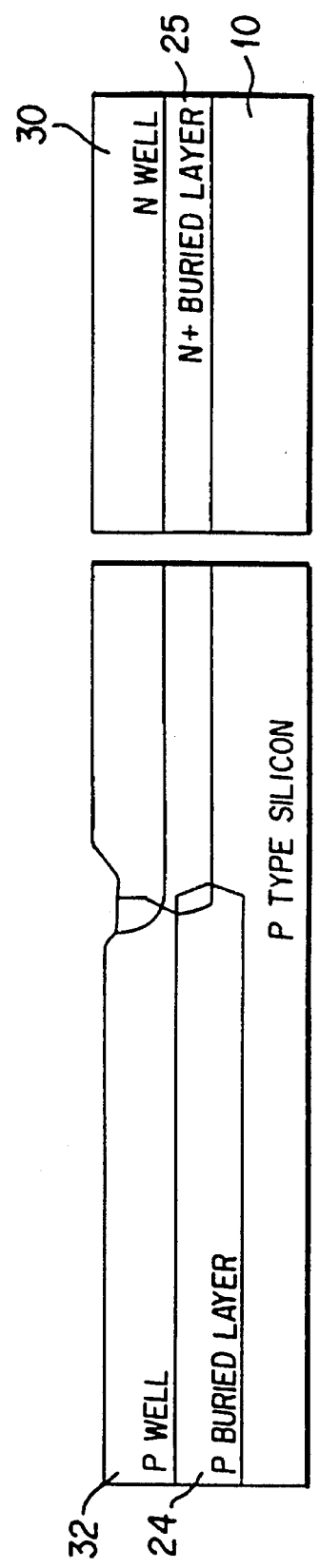
FIG. 3 is a subsequent cross section after formation of P and N wells.

After formation of the silicon nitride layer 29, another well known photolithographic process is performed to define portions of the epitaxial layer in which N conductivity type wells are desired. These regions will correspond to the locations of the bipolar transistors and the P channel MOS transistors. After removal of the silicon nitride 29 from the regions where the N-type wells are desired, another ion-implantation step introduces arsenic, phosphorus, or other suitable impurity to form the N-type well 30 shown in FIG. 3. After the N-type wells have been implanted, preferably to an impurity concentration of $10^{16}$ atoms per cubic centimeter, the structure is oxidized to form a thin layer of silicon dioxide (not shown) above the implanted N well. In the preferred embodiment, layer 20 will be sufficiently thick to prevent ions from passing through it during a subsequent ion-implantation step. The remaining silicon nitride then is removed using well-known wet etching techniques and a P well implant 32 then dopes the regions of the epitaxial layer wherein N channel MOS transistors are desired. After the P-type dopant is driven in, all of the silicon dioxide is removed to create a structure with the cross-sectional appearance as shown in FIG. 3. At this stage in the process, a self-aligned twin-well structure has been created in which the N-well and the P-well have an essentially planar upper surface. Advantageously, this provides a P-well and an N-well which are in a single focal plane. For state of the art mask imaging technology with its shallow depth of field, this provides a substantial advantage. Of course, thousands of similar structures will be present elsewhere on the wafer.

Next, masks are defined for the active device areas within the P-well. This is achieved by first forming another thin layer of silicon dioxide and an overlying layer of silicon nitride across the entire surface of of the structure, and then photolithographically exposing regions of the P well 32 where N-type impurity is desired for forming the N channel devices. As shown by FIG. 4, a blanket implant introduces the P-type impurity 33 to a concentration of $5 \times 10^{16}$ atoms per cubic centimeter in the desired locations.

After introduction of the P-type impurity, the photoresist 34 is removed and a new layer deposited to protect the silicon in the P well 32. Then, again using conventional photolithographic processes, the new photoresist is patterned to expose the areas in the N well 30 where silicon dioxide field isolation is desired. Following etching of the silicon nitride layer using the photoresist layer as a mask, the structure is subjected to a prolonged oxidation process to form field oxide layers 35 (see FIG. 5) wherever the silicon nitride did not cover the underlying silicon. In general, the field oxide surrounds each transistor to electrically separate it from every other transistor on the substrate. Additionally, the field oxide regions isolate the collector contact of the bipolar transistor from neighboring regions, as will be explained later.

After the field oxidation step, all of the silicon nitride is removed. If desired, a sacrificial oxidation step may be performed at this stage of the process to oxidize away a small portion of the upper surface of the device to further planarize the structure. Next, as shown by FIG. 5, a threshold implant is performed to adjust the threshold voltage of the active devices formed in the structure. At this stage, the structure includes silicon substrate 10, N-type buried layer 25, N well 30, P-type buried layer 34, P well 32, and silicon dioxide field regions 35. If a sacrificial oxidation step was performed, then the resulting silicon dioxide is now removed. Following this step, the thereby exposed upper silicon surface is oxidized to provide a thin layer of silicon dioxide 38, which layer functions as the gate insulator in the CMOS devices. In the preferred embodiment, gate oxide layer 38 is approximately 200 Angstroms thick.

After formation of the gate oxide 38, a first layer of polycrystalline silicon 40 (see FIG. 6) is deposited across the structure and doped to render it conductive. Then using conventional masking and etching techniques, the polysilicon is defined into the gates 41 and 42 of the CMOS transistors. The gate 41 of the N channel transistor and the gate 42 of the P channel transistor are shown in FIG. 6. In the preferred embodiment, the first layer of polycrystalline silicon is approximately 3250 Angstroms thick. Following formation of the gates, the structure is masked to expose only the N-channel devices and then lightly implanted with N conductivity type impurity, using the gates as masks, to form doped regions 45 in the P well 32. These regions provide "lightly doped" drain structures for the nMOS transistors.

A thin layer of silicon dioxide (not shown) is deposited, for example, by CVD on the silicon epitaxial wells 30 and 32 and polycrystalline silicon layer 40. Preferably, about 2500 Angstroms of silicon dioxide is deposited. Next, an anisotropic etch creates sidewall spacer oxide regions 47, as also shown in FIG. 6.

After formation of the sidewall spacers, a mask (not shown) is formed over all of the bipolar regions except where a collector contact 56 is desired (see FIG. 7), and over all of the P channel MOS region. Then an implantation step is performed to dope the N conductivity type sources and drains 53, the N conductivity type collector contact 56, and the butting contact 55. In the preferred embodiment, these regions are doped with $10^{20}$ atoms per cubic centimeter of N conductivity type impurity. Following that doping operation, another mask (not shown) is formed across all of the surface area of the wafer except for where intrinsic bases 52 of the bipolar transistors are desired. Then the structure is implanted with P conductivity type dopant to dope the base region of the bipolar transistor. The mask is then removed and a new mask 57 formed across the surface of the structure except where the extrinsic base 54 of the bipolar transistor is desired, as well as the P-type source and drain regions 50 of the P channel MOS transistor. Another implant is performed, this time forming the P channel sources and drains and the extrinsic base of the bipolar transistor. FIG. 7 shows the resulting structure with the P channel source/drains 50, the intrinsic bipolar base 52, the extrinsic bipolar base 54, and the previously doped N channel sources and drains 53. The butting contact 55 is also shown.

All of the photoresist is removed from the surface of the structure, and a layer 60 of thermally formed silicon dioxide approximately 200 Angstroms thick is grown, followed by 1200 Angstroms deposited by CVD (see FIG. 8). This thin layer 60 covers the entire surface of the structure, that is, the polycrystalline silicon gate electrodes and butting contact, the exposed upper surface of the silicon epitaxial layer, and the surfaces of the field oxide regions. Layer 60 of high temperature oxide will electrically isolate the first layer of polycrystalline silicon electrodes from the second layer except where vias are formed.

After formation of the thin oxide layer 60, a mask is formed to define contact openings wherever the second layer of polycrystalline silicon is desired to contact the surface of the structure. One such location is above the doped region 55 of the butting contact area. Another such region is where the emitter 62 of the bipolar transistor is to be formed.

Next, openings are etched through the oxide layer 60 using well known etching techniques, and a second layer of polycrystalline silicon 63 about 1500 Angstroms thick is deposited across the upper surface of the structure. This second layer of polycrystalline silicon will contact the first layer of polycrystalline silicon and the underlying doped region 55 at the butting contact 40, and will contact the epitaxial layer in the bipolar transistor area where the emitter 62 is to be formed.

After deposition of the second layer of polycrystalline silicon, a blanket ion-implantation step dopes the polycrystalline silicon second layer and lowers its resistance. This implant provides high resistance polycrystalline silicon suitable for resistors. In contrast to prior art processes, however, the polysilicon is also used as a circuit load element. Employed as a load resistor for a static random access memory (SRAM) fabricated using the process of this invention, the polycrystalline layer will have a very high resistance—on the order of gigaohms. The very low capacitance of polysilicon deposited on oxide provides faster switching speeds than conventional prior processes which employed diffused loads.

If lower resistance regions are also desired, a subsequent masked implant may be employed to further dope regions of the second layer of polycrystalline silicon. Then, using conventional photolithographic techniques, the second layer of polycrystalline silicon is masked and etched to define the butting contact, the emitter contact, and resistors (not shown). The emitter is formed by impurity diffusion out of the second layer of polycrystalline silicon. By doping the second layer of polycrystalline silicon before patterning it, dopant misplacement due to mask misalignment is prevented. The appearance of the structure at this stage in the process is shown in FIG. 8.

In the preceding discussion, the emitter was formed by diffusion out of the doped polycrystalline silicon layer 63. While this provides a self-aligned emitter 62 and therefore is advantageous, this approach to emitter formation results in a very shallow N conductivity type emitter, requiring a very shallow base. Such shallow bases are known to have a large base resistance. Furthermore, in the formation of self-aligned emitters from doped polycrystalline silicon, the presence of a very thin layer of silicon dioxide, commonly known as interface oxide, will be present on the upper surface of the epitaxial silicon beneath the polycrystalline silicon. This interface oxide increases the resistance of the emitter contact. In an alternative process of this invention, these disadvantages are overcome by doping the emitter using a two step process. In a first step, prior to formation of the second layer of polycrystalline silicon, the emitter is doped using either an opening in layer 60 or a conventional masking operation. In the later case, a photoresist mask is deposited across the upper surface of the structure, an opening formed therein, and dopant introduced to define the emitter. Then the mask is stripped and the second layer of polycrystalline silicon is deposited and doped to create a self-aligned emitter contact region. Using this technique allows a deeper emitter, thereby minimizing the base resistance, yet provides a substantially self-aligned emitter contact having very low interface resistance because the out diffusion of dopant from the polycrystalline silicon helps break down the resistance of the interface oxide. In some prior art structures, the interface oxide resistance was sufficiently high as to require heating the structure to break down the interface. This is undesirable because heating a BiCMOS structure causes the dopants for the MOS transistors to move, making process control substantially more difficult. This technique, while described above in conjunction with formation of an emitter, can be employed whenever a polycrystalline or amorphous layer must make a low resistance connection to a silicon body.

Figure 9:
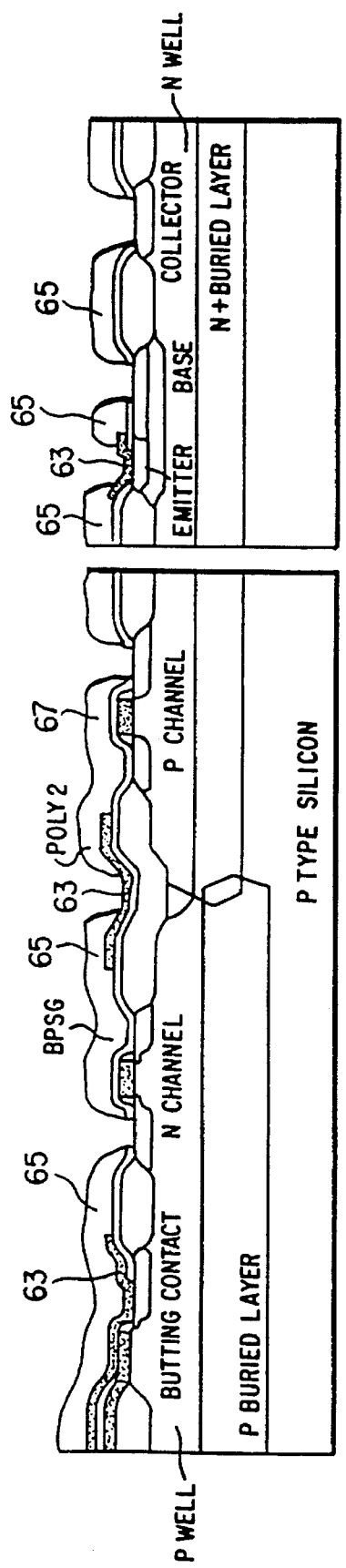
FIG. 9 is a subsequent cross section after etching contact openings to the second layer of electrodes through an intervening dielectric layer.

Following the definition of the second layer of polycrystalline silicon (under either embodiment above), approximately 1000 Angstroms of undoped low temperature silicon dioxide are deposited across the upper surface of the structure, for example, using chemical vapor deposition. Then about 11000 Angstroms of boron/phosphorus-doped glass 65 (BPSG) are deposited across the upper surface (see FIG. 9). Preferably this glass comprises about 2–4% boron and about 5–7% phosphorus by weight. About 2% boron and about 6.5% phosphorus, each, plus or minus approximately 0.5%, yields the best results. Additional boron can cause crystallization, while additional phosphorus can cause corrosion. The use of two different layers to form the isolation of the second polysilicon layer 63 for this step creates a layer which has a differential etch rate, and this acts as an etch stop. The phosphorus rich doped glass has approximately a 9:1 etch selectivity over the undoped glass in a 10% hydrofluoric acid solution. As will be explained, this differential etch stop allows significant misalignment of contact locations yet prevents electrical shorts.

After deposition of both layers, the doped glass 65 is "reflowed" by heating it in steam to about 920° C., resulting in a smoother upper layer, thereby allowing improved mask alignment and etch location positioning, as well as improved metal step coverage. After reflow, the surface may be etched back to any desired thickness. In the preferred embodiment, wet-etching removes approximately 5000 Angstroms of glass. Alternatively, the wet- etching may be deferred until later in the process, or dry etching may be employed.

Figure 9A:
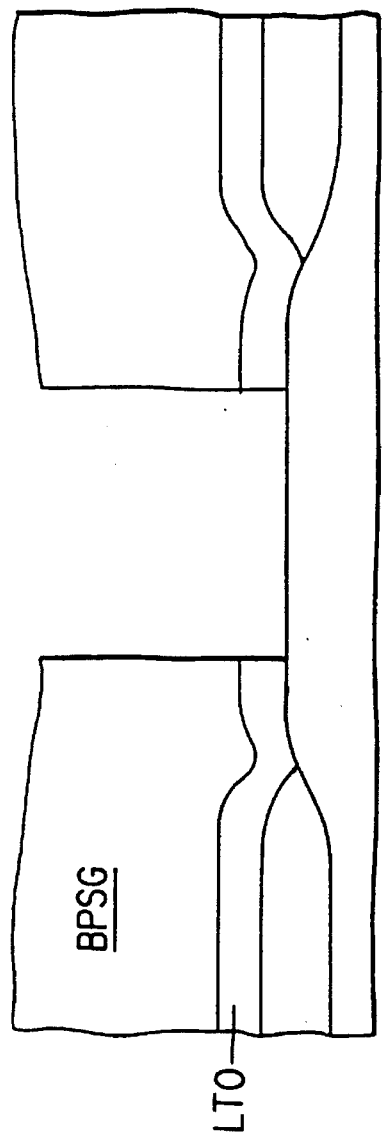
FIG. 9A is an enlarged cross section of a contact opening after anisotropic etching.
Figure 9B:
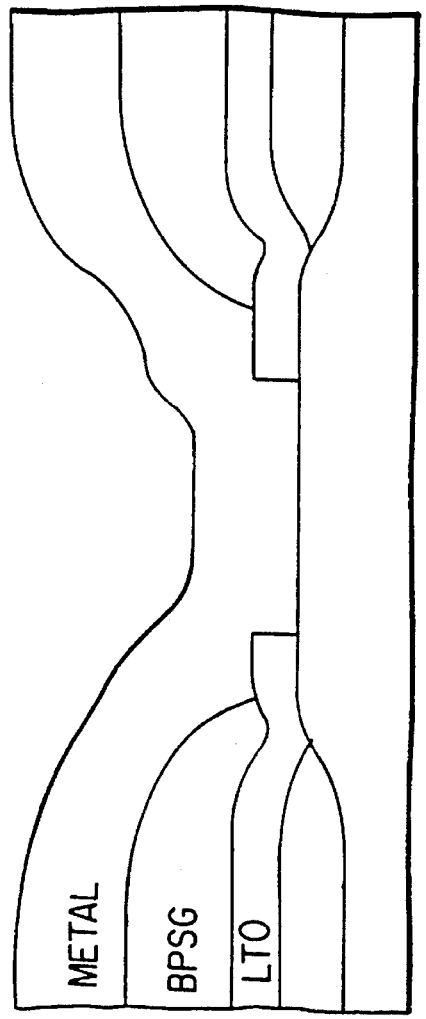
FIG. 9B is an enlarged cross section of the contact opening after isotropic etching.

Using a mask, a reactive ion etch then is performed to etch completely through both the doped and undoped glass to form the contact opening, as shown in FIG. 9A in greater detail. Then, either before or after removing the mask, using a 10:1 unbuffered hydrofluoric acid solution, the contact openings are further etched. The wet-etch essentially will stop after removal of the BPSG, leaving the undoped low temperature oxide in the manner shown in FIG. 9B. Using this technique in FIG. 9, openings in the layer allow a connection to each of the N and P channel devices, as well as connections to each electrode of the bipolar transistor.

An important benefit of this technique for forming the contact openings is that the openings have a smoothly-rounded profile at their upper extreme, tapering to a vertical wall at the location where the to-be-formed electrode connects to the underlying structure. This profile enables better step coverage for the to-be-formed overlying metal layer used to provide the electrical connection.

Figure 10:
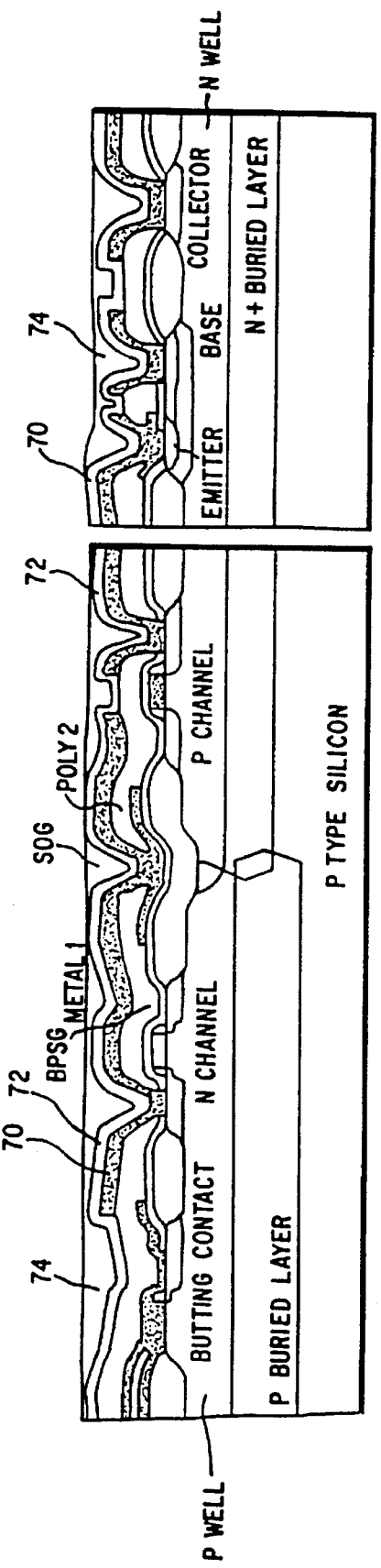
FIG. 10 is a subsequent cross section after planarization of the first layer metal.

Next, as shown in FIG. 10, a first layer of metal 70 is sputtered across the upper surface of the structure and patterned, again using well known photolithographic techniques. A thin layer of silicon dioxide 72 is deposited across the metal 70, and then a layer of glass 74 is spun on over the deposited silicon dioxide 72 to assist in planarizing the structure. The appearance of the structure at this stage of the process is shown in FIG. 10.

Figure 11:
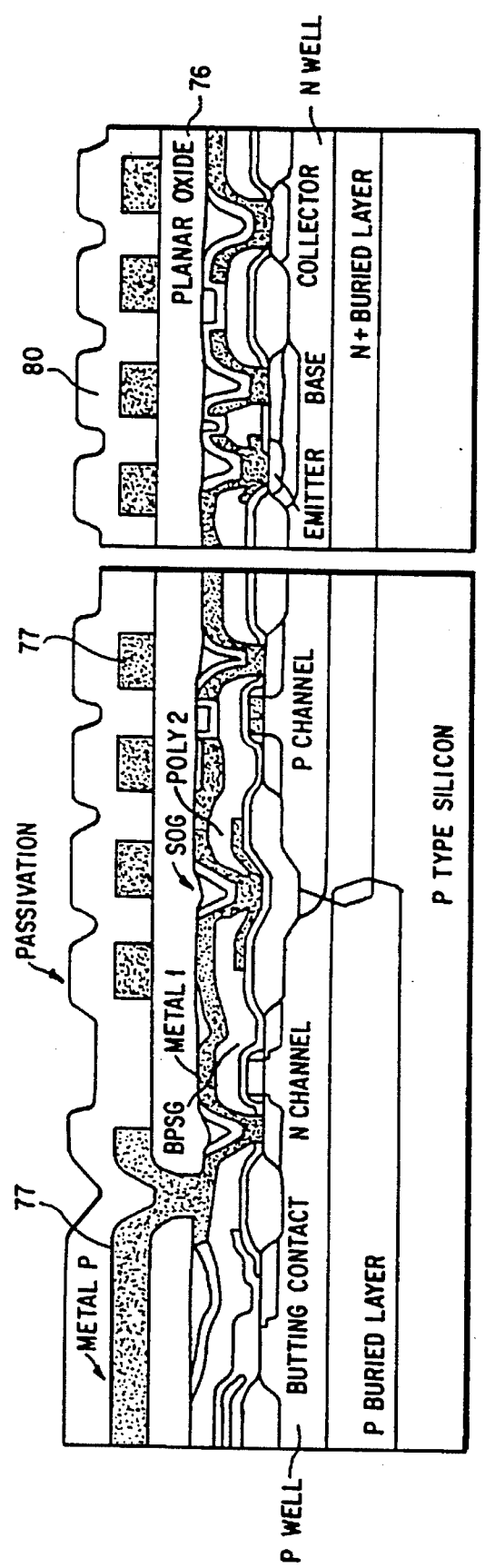
FIG. 11 is a cross section of the completed BiCMOS structure.

Excess glass 74 then is etched off to further planarize the structure, and a layer of intermetal oxide 76 deposited across the upper surface of the structure. Contact openings are etched in the intermetal oxide 76 and a second layer of metal 77 deposited. This second layer of metal 77 is patterned, again using conventional masking and etching techniques, and then the entire structure is coated with passivating material 80. The resulting structure is shown in FIG. 11.

The foregoing description of the preferred embodiment has included many details to enable a more complete understanding of the process of the invention. These details are provided only for explanation. The scope of the invention may be ascertained from the appended claims.

We claim:

1. A method of forming a first load having a first resistance level and a second load having a second resistance level in a common layer of polysilicon formed in a semiconductor device structure, the method comprising the steps of:

(a) forming a layer of polysilicon having said first resistance level on said semiconductor device structure;

(b) forming a mask on said layer of polysilicon to define selected areas of said polysilicon layer to be implanted with a dopant;

(c) implanting said selected areas of said polysilicon layer with said dopant to modify the resistance of said selected areas so that said selected areas have said second resistance level; and (d) etching away selected regions of said polysilicon layer to form first load regions having said first resistance level and second load regions having said second resistance level.

2. A method of forming a semiconductor device structure having a first load resistor having a first resistance level and a second load resistor having a second resistance level, which is substantially lower than said first resistance level, said method comprising the steps of:

(a) forming N-wells, P-wells, field oxide regions, N+ and P+ source and drain regions, and polysilicon gate regions in said semiconductor device, said polysilicon gate regions formed from a first polysilicon layer;

(b) forming a layer of silicon dioxide on the structure resulting from step (a); (c) forming a mask on said silicon dioxide layer to define contact openings in said silicon dioxide layer;

(d) etching said silicon dioxide layer to form said contact openings;

(e) depositing a second layer of polysilicon, which has a first conductance level, so that said second layer of polysilicon covers said contact openings;

(f) masking said second polysilicon layer to define selected exposed areas of said select polysilicon layer;

(g) implanting said exposed areas of said second polysilicon layer with a dopant to increase the conductivity of said selected areas of said second polysilicon layer to a second conductance level;

(h) masking areas of said second polysilicon layer to define said first load resistor and said second load resistor, said first load resistor being formed from an area of said second polysilicon layer masked by step (f) and said second load resistor being formed from an area of said second polysilicon layer implanted with said dopant of step (g); and (i) etching away unmasked areas of said second polysilicon layer to form said first and second load resistors.

* * * * *